United States Patent [19]

Molldrem, Jr.

[11] 4,388,589
[45] Jun. 14, 1983

[54] COLOR-EMITTING DC LEVEL INDICATOR

[76] Inventor: Bernhard P. Molldrem, Jr., 201 W. 77th St., New York, N.Y. 10024

[21] Appl. No.: 161,673

[22] Filed: Jun. 23, 1980

[51] Int. Cl.³ ............................................ G01R 19/00
[52] U.S. Cl. ..................................... 324/96; 324/122; 324/133; 340/815.03
[58] Field of Search ........................ 324/96, 122, 133; 340/366 R, 815.01, 815.03

[56] References Cited

U.S. PATENT DOCUMENTS

| | | | |
|---|---|---|---|
| 3,191,039 | 6/1965 | Gucwa | 250/208 |
| 3,873,979 | 3/1975 | Craford et al. | 324/96 |
| 3,969,672 | 7/1976 | Wallander et al. | 324/133 |
| 4,005,365 | 1/1977 | Berger et al. | 324/133 |

Primary Examiner—Ernest F. Karlsen

[57] ABSTRACT

A DC level indicator represents a sensed DC level by a color of emitted light. The indicator includes a plurality of lamps or LED's, each emitting a respective primary color, and a current-feeding circuit supplying current to each of the lamps or LED's when the sensed voltage level is in a respective predetermined subrange of the voltage range of the indicator. Preferably, the subranges overlap one another somewhat for at least some input levels and the indicator presents a complementary color for such levels. In one version, red, green, and blue lamps are driven by respective transistor switching circuits so that the voltage level is indicated by apparent spectral colors, from red, through orange, yellow, green, cyan, blue, and violet, to magenta as the voltage level sweeps from one end of the range to the other. In another version, an AC signal is mixed with the DC input level to form a mixed signal that is fed to a pair of LED's, one red and one green, in an anti-parallel, or back-to-back arrangement. Here, as the DC level sweeps through the range, the indicator's color changes from red, through orange and yellow, to green.

13 Claims, 4 Drawing Figures

COLOR-EMITTING DC LEVEL INDICATOR

BACKGROUND OF THE INVENTION

This invention relates to electric meters and indicators, and particularly relates to DC level indicators in which the DC level is represented by an analog quantity—here by a color as it appears to a person looking at the indicator.

Various meters are known that indicate a signal level by the position of a hand or lever or by a digital display on the face of the meter.

Indicators are also in use in which lamps are lit or extinguished in accordance with the level of an input signal. Normally, in such indicators, the only apparent indication is the lamp intensity (i.e., OFF, partially ON, or ON), or, if several lamps are used, the number of lamps that are lit.

Such indicators do not give a very good indication of how far the detected level is from some threshold or desired level. For instance, if the lamp is a speed indicator, it will indicate underspeed (OFF) or overspeed (ON) but does not alert an observer to the degree of overspeed or underspeed.

A multiple-lamp indicator requires the observer to count the number of lit lamps, and as such requires the observer to concentrate, and does not permit him to determine the level by a casual glance or, if many levels are being monitored, to monitor all the levels quickly.

By contrast, if the measured level were represented by the color of light, an observer would be able to determine changes in the level at a glance. Also, if many conditions are being monitored at once, and if a color, rather than a conventional meter reading, were used for each of the conditions, the observer could quickly determine any conditions that might be changing sufficiently, for instance, to indicate a trend toward malfunction.

OBJECTS AND SUMMARY OF THE INVENTION

It is an object of this invention to provide a DC level indicator that avoids the shortcomings of state-of-the-art indicators.

It is a further object to provide a DC level indicator that represents a DC level by a color of light.

It is another object to provide a DC level indicator that can be read easily at a glance, and which can indicate to an observer the degree of variance of the measured DC level from one desired level.

In accordance with an aspect of this invention, a DC level indicator comprises a DC input for receiving the DC level within a range having a plurality of subranges; a color light generating circuit formed of a plurality of lamps, LED's or the like, each radiating light of a respective primary color, and positioned together so that when more than one of the lamps or LED's emits, the resulting emitted light appears as a blend of the respective colors; and a drive circuit for supplying current to each of the lamps or LED's in response to the received DC level so that each lamps or LED radiates its respective color light when the DC level is within a respective subrange, but does not radiate when the DC level is outside the respective subrange. Preferably, the subranges overlap somewhat, so that complementary colors (a combination of two primary colors) appear when the DC level is in the overlap portion.

A first embodiment employs a red, a green, and a blue lamp and the drive circuit turns these lamps ON and OFF at predetermined voltages so that the indicator color changes from red, through orange, yellow, green, cyan, blue, and violet, to magenta as the DC level changes.

A second embodiment employs one red LED and one green LED connected in anti-parallel, back-to-back configuration. In this embodiment, an AC signal is mixed with the DC level to form a superimposed or mixed signal which is fed to one end of the pair of LED's, the other end of which is at a predetermined voltage. Here, the indicator color is green for low levels and red for high levels, and the color sweeps from green through yellow and orange to red as the DC level increases.

This invention can be used to advantage where it is desired to determine an appropriate level at a glance, where it is desired to visually detect, by observing a spectral color, whether a device is in some desired condition, or if not in such condition, how a level needs to be changed in order to achieve the condition.

DETAILED DESCRIPTION OF PREFERRED EMBODIMENTS

Figure 1:
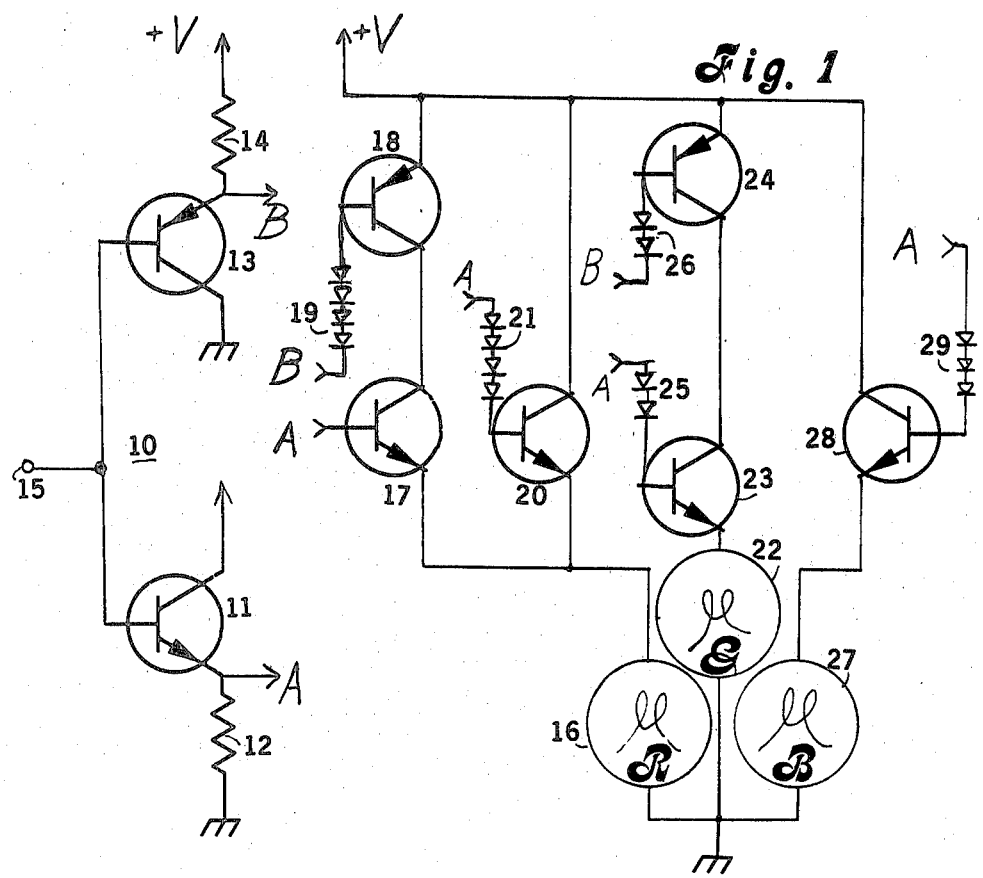
FIG. 1 is a schematic diagram of one embodiment of this invention.

Referring initially to FIG. 1, in one embodiment of this invention, an input stage 10 is formed of an NPN emitter-follower transistor 11 with its collector connected to a source voltage $+V$ and its emitter connected to a grounded load resistor 12, and a PNP emitter-follower transistor 13 with its collector grounded and its emitter coupled through a load resistor 14 to the source voltage $+V$. The bases of transistors 11 and 13 are connected to input 15 to receive an input level $V_{in}$ to be indicated. Input stage 10 provides isolated levels A and B from the emitters of transistors 11 and 13, respectively. Input stage 10 provides isolation and could be omitted in a rudimentary construction.

A "red" indicator circuit is formed of a red colored lamp 16 connected to ground and to the emitter of an NPN switching transistor 17. The collector of transistor 17 is connected to the collector of complementary (PNP) switching transistor 18 whose emitter is connected to source voltage $+V$. The base of transistor 17 is coupled to receive input A, and the base of transistor 18 is coupled through biasing diodes 19 to receive input B. Lamp 16 is also coupled to the emitter of another switching transistor 20, whose base is connected through biasing diodes 21 to receive input A and whose collector is coupled to source voltage $+V$.

A "green" indicator circuit is formed of a green colored lamp 22 coupled to ground and, via complementary switching transistors 23 and 24, to source voltage $+V$. The respective bases of transistors 23 and 24 are coupled through biasing diodes 25 and 26 to receive inputs A and B.

A "blue" indicator circuit is formed of a blue colored lamp 27 coupled to ground and through a switching transistor 28 to source voltage +V.

The three lamps 16, 22, and 27 are located very close to one another so as to appear to be at the same location. Also, transistors 17, 18, 20, 23, 24, and 28 do have narrow, but finite active regions.

Figure 2:
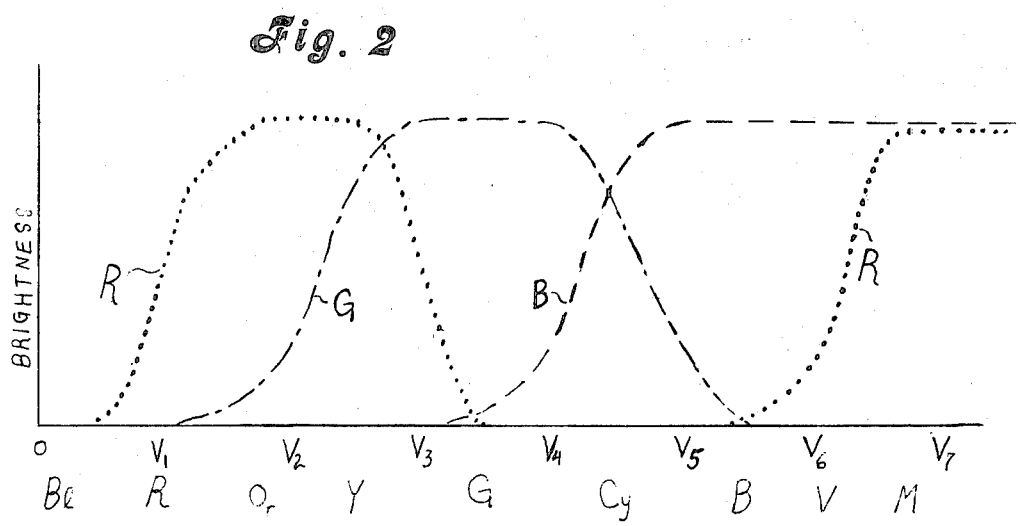
FIG. 2 is a chart for explaining the operation of the embodiment of FIG. 1.

The red, green and blue circuits are turned ON and OFF in accordance with the input level $V_{in}$ as shown in FIG. 2. At a zero input level ($V_{in}=0$), all the lamps 16, 22, and 27 are OFF. Then, as level $V_{in}$ is raised to a first voltage $V_1$ (here the base-emitter voltage of transistor 17) transistor 17 is made to conduct. As transistor 18 is already biased on, current flows to the red lamp 16 causing it to emit red light.

At a somewhat higher voltage $V_2$ where input level A is higher than the forward bias voltage of biasing diodes 25 and the base-emitter junction of transistor 23 that transistor beings to conduct. As transistor 24 is already biased on, current flows in green colored lamp 22. Thus, lamp 22 emits green light. However, as red lamp 16 is also ON, a viewer will see light that is initially orange as lamp 22 emits dimly, then yellow as the level $V_{in}$ is raised slightly so that lamp 22 emits more fully.

As input level $V_{in}$ is raised to a still higher voltage $V_3$, the difference between source voltage +V and received input B will not be sufficient to overcome the forward bias voltages of diodes 19 and the base-emitter junction of transistor 18, and the latter will be shut OFF, so that only the green indicator circuit will remain ON.

At a yet higher voltage $V_4$, the transistor 28 in the blue circuit begins to conduct and blue colored lamp 27 is turned ON producing, with green colored lamp 22, cyan light. At an again higher voltage $V_5$, transistor 24 is shut OFF, so that green colored lamp 22 is turned OFF and only blue light is emitted. Then, at another higher voltage $V_6$, transistor 20 is turned ON so that red colored lamp 16 again begins to emit light. The observer will then see violet light as red colored light 16 emits dimly and magenta light as it emits more strongly.

The intensity of each of the lamps 16, 22, and 27 follows the curves on FIG. 2. Red light will be emitted as shown in the dotted lines, green light will be emitted as shown in the chain line, and blue light will be emitted as shown in the dash line in that view. The apparent color emitted from the lamps 16, 22, and 27 changes gradually through the visual spectrum as the input level $V_{in}$ is raised through the range of the indicator circuit.

LED's can be used in place of the lamps 16, 22, and 27, or a single LED device could be used in which red, blue, and green light emitting diodes are all formed on the same semiconductor chip. Also, other biasing circuits, besides diodes 19, 21, 25, 26, and 29 are well-known and could readily be used to bias transistors 17, 18, 20, 23, 24, and 28.

Figures 3, 4:
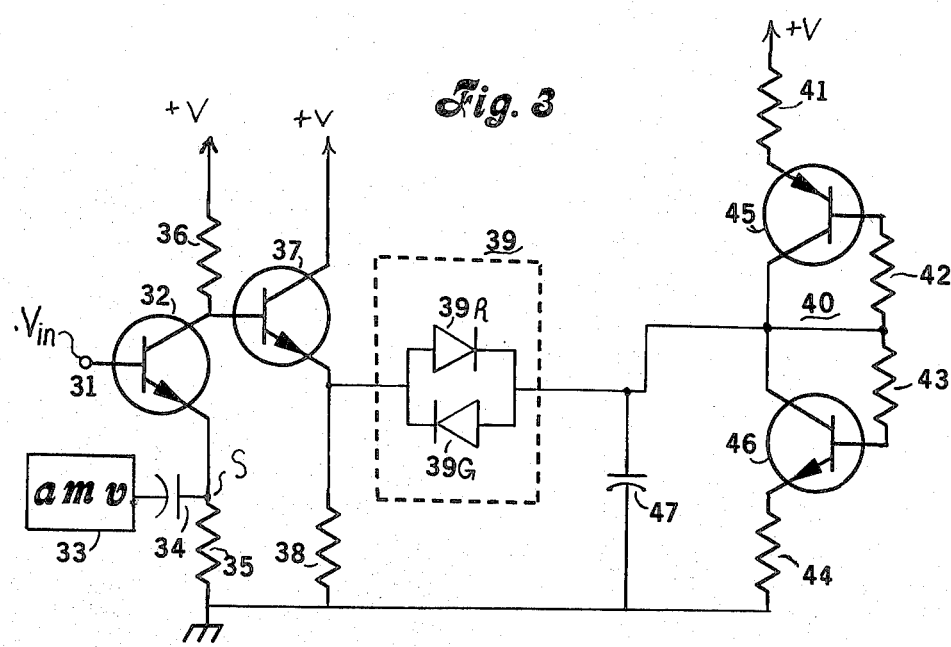
FIG. 3 is a schematic diagram of another embodiment of this invention.
FIG. 4 is a chart for explaining the operation of the embodiment of FIG. 3.

A second embodiment of this invention is shown in FIG. 3. A voltage input level $V_{in}$ is applied to input terminal 31 and thence to the base of a mixer transistor 32 a fixed-level oscillating voltage is produced in an oscillator, here an astable multivibrator 33 and is applied through a condenser 34 to the emitter of transistor 32 which is coupled to ground through a resistor 35. A load resistor 36 connects the collector of transistor 32 to source voltage +V. A signal S representing the level $V_{in}$ mixed with the oscillating signal is provided at the collector of transistor 32 to the base of emitter-follower transistor 37 whose collector is coupled to source voltage +V and whose emitter is coupled to ground through load resistor 38. The emitter of transistor 37 then feeds the signal S to one end of a so-called "tricolor" LED device 39 formed of a red LED 39R and a green LED 39G connected in anti-parallel or back-to-back configuration. The other end of the LED device 39 is connected to a constant voltage circuit 40 here constructed to provide a voltage equal to half the source voltage +V. This circuit 40 is formed of voltage divider resistors 41, 42, 43, and 44 and transistors 45 and 46. A series circuit is formed by resistor 41, the emitter and collector electrodes of transistors 45 and 46, and resistor 44 to bridge between source voltage +V and ground. Resistors 42 and 43 are coupled between the base and collector of transistors 41 and 42, respectively. The collectors of the latter transistors are also connected to one plate of a capacitor 47, whose other plate is grounded. It is apparent that the junction of the collectors of transistors 41 and 42 will remain substantially at a voltage +V/2 despite any fluctuation of current through LED device 39.

Thus, green LED 39G alone emits when the input level $V_{in}$ is below a level determined by the difference between voltage +V/2 and the amplitude of the AC signal of multivibrator 33, red LED 39R alone emits when the level $V_{in}$ is above a level determined by the sum of voltage +V/2 and the amplitude of the AC signal, and both LED's 39G and 39R when the input level $V_{in}$ is between these levels. The relation of input level $V_{in}$ to the color of light emitted by device 39 is explained with reference to FIG. 4. As the input level $V_{in}$ fluctuates in time, for example, as shown in the solid central line in FIG. 4, the signal S fed to LED device 39 fluctuates, at the frequency of multivibrator 33, above and below the input level $V_{in}$ by a predetermined amount.

When the input level $V_{in}$ is small, as in region G, the signal S remains less than +V/2, only green LED 39G is forward biased, and the device 39 glows deep green. Then, if level $V_{in}$ is raised as shown in region Y-G, signal S remains less than +V/2, on the average, but does enjoy excursions above +V/2. Thus, green LED 39G emits green light fully, but LED 39R also emits some red light, and device 39 appears yellow green. As level $V_{in}$ is raised as shown in region Y, signal S enjoys excursions an equal amount above and below voltage +V/2 and device 39 appears yellow. Then, if level $V_{in}$ is raised as shown in region O, signal S is on the average above voltage +V/2, but has excursions below that level, and device 39 appears orange. Finally, if level $V_{in}$ is raised further, as shown in region R, signal S remains above the voltage +V/2 and device 39 appears deep red.

Here, as the voltage level $V_{in}$ is swept through the range of the indicator circuit, the color of light emitted by the device correspondingly sweeps through the visual spectrum of green, through yellow and orange, to red. As the human eye is quite sensitive to changes in color in the red to green part of the spectrum, this embodiment of the invention provides an indicator that is simple and economical to construct, yet sufficiently sensitive for a large variety of applications.

The level indicator according to this invention can enjoy many applications, such as to indicate the received signal strength in a radio receiver or to indicate the audio output level in an amplifier. The level indicator can also be used to indicate some operating parameter of an automobile (e.g., fuel level, oil pressure, or water temperature) and in such application has a distinct advantage of showing the degree and direction of deviations of such parameter from desired levels. The level indicator, of course, has many other applications which will be apparent to persons of ordinary skill.

Furthermore, many variations and modifications of this invention are possible without departing from the scope and spirit of this invention, which is to be measured by the appended claims.

I claim:

1. A DC level indicator wherein a sensed DC level of a particular polarity and within a particular range is indicated by the apparent color of light comprising DC input means receiving said DC level within said particular range and having said particular polarity, said range having a plurality of subranges each smaller than said range;

color light generating means formed of a plurality of light emitting means, each radiating light of a respective primary color, and positioned together so that when more than one of said light emitting means emits light the resulting emitted light appears as a blend of the respective colors; and drive means connected to said DC input means for supplying current to each of said light emitting means that varies in response to the received DC level so that each said light emitting means radiates its respective color light when said DC level is within a respective subrange, but substantially ceases to radiate when said DC level is outside said respective subrange but within said predetermined range and so that within an overlapping portion of said subranges two of said light emitting means emit their respective color light, said drive means being powered by voltage of said particular polarity.

2. A DC level indicator according to claim 1, wherein said subranges overlap at least in part, and at least two light emitting means cooperate to produce complementary-colored light when said DC level is in the overlapping portion of their respective subranges.

3. A DC level indicator wherein a sensed DC level is indicated by the apparent color of light comprising DC input means receiving said DC level within a range having a plurality of overlapping subranges;

color light generating means formed of first, second, and third light-emitting elements of respective first, second, and third primary colors, and positioned together so that the resulting emitted light appears as a blend of the respective primary colors; and drive means coupled to said DC input means for supplying current to each of said light-emitting elements of said color light generating means, and operative to vary said current in response to the received DC level so that each said light emitting element radiates its respective color light when said DC level is in a respective subrange, but substantially ceases to radiate when said DC level is outside said respective subrange, including a first, a second, and a third switching circuit to switch said first, second, and third light-emitting elements on when said DC level is within said first, said second, and said third subrange, respectively, and to switch the respective elements off otherwise, two of said elements being switched on by their respective switching circuits in an overlapping portion of their respective subranges.

4. A DC level indicator according to claim 3, wherein at least one of said first, second, and third switching circuits includes a pair of complementary transistors each having current-conducting electrodes and a control electrode, connected with their current-carrying electrodes in series so that the current passing therethrough controls the radiation of light by the respective light emitting element, and with their control electrodes coupled to said DC input means; and biasing means coupled to said control electrodes so that both of said transistors conduct when said DC level is within the respective subrange, but at least one thereof is rendered non-conductive outside the respective subrange.

5. A DC level indicator according to claim 4, wherein the respective subrange associated with said at least one switching circuit is divided into an upper and a lower part separated from one another, and said at least one switching circuit includes at least an additional transistor coupled to control the radiation of light by said respective light emitting element, and additional biasing means coupled between said DC input means and said additional transistor, so that the pair of transistors conduct when said DC level is in one of the upper and lower parts of said subrange, and the additional transistor conducts when said DC level is within the other part of said subrange.

6. A DC level indicator wherein a sensed DC level is indicated by the apparent color of light comprising DC input means receiving said DC level within a range having a plurality of subranges;

color light generating means including a pair of back-to-back, oppositely-polarized LED's emitting different respective primary colors, and positioned together so that when more than one such LED emits light the resulting emitted light appears as a blend of the respective colors; and drive means coupled to said DC input means for supplying current to said LED's as a function of the received DC level so that each said LED radiates its respective color light when said DC level is within a respective subrange but substantially ceases to radiates when said DC level is outside said respective subrange, and including mixing means for superimposing an AC signal on a DC signal corresponding to said DC level, to provide a resulting mixed signal to one end of said pair of LED's, and bias means coupled to the other end of said pair of LED's so that one only of said pair emits light of its color when said DC level is below a first voltage, the other only of said pair emits light of its color when said DC level is above a second voltage, and both LED's of said pair emit light of their respective colors when said DC level is between said first and second voltages.

7. A DC level indicator according to claim 6, wherein said AC signal is provided at a sufficiently high frequency that, for any DC level between said first and second voltages, the light emitted by said pair of LED's appears as a single color blended from said one and said other primary colors.

8. A DC level indicator according to claim 6, wherein said first voltage is determined by the difference between the level of said bias means and the level of said AC signal, while said second voltage is determined by the sum of the levels of said bias means and said AC signal.

9. A DC level indicator circuit to which a "tricolor" LED device, formed of back-to-back parallel LED's of different colors of visible light, is to be connected, the device having a pair of terminals to which electrodes of said device are to be coupled; comprising means generating an AC signal;

means receiving an input DC voltage; and drive means having an input coupled to said generating means and another input coupled to said receiving means for providing across said pair of terminals said AC signal with a DC component thereof governed in accordance with the received input DC voltage, such that the apparent color of light emanating from said LED device is substantially of one said color when said input DC voltage is below a first level, is substantially of the other, different color when said input DC voltage is above a second level, but when said input DC voltage is between said first and said second levels, said AC signal alternately switches said LED's of said device on, so that the apparent color of light emanating therefrom is a blend of said colors.

10. A DC level indicator circuit according to claim 9, wherein said means generating said AC signal and said drive means are powered by a DC source of the same polarity as the input DC voltage.

11. A DC level indicator wherein a sensed DC level of a particular polarity is indicated by the apparent color of light comprising DC input means receiving said DC level within a range having a plurality of overlapping subranges; color light generating means formed of first, second, and third light-emitting elements of a respective first, second, and third primary colors, and positioned together so that the resulting emitted light appears as a blend of the respective primary colors; and drive means coupled to said DC input means for supplying current that varies in accordance with said DC level to each of said light-emitting elements of said color light generating means in response to the received DC level so that each said light-emitting element radiates its respective color light when said DC level is within a respective subrange, but substantially ceases to radiate when said DC level is outside said respective subrange but within said predetermined range, including a first, a second, and a third switching circuit powered by voltage of said particular polarity to switch said first, said second, and said third light-emitting elements on when said DC level is within said first, said second, and said third subrange, respectively, and to switch the respective elements off otherwise, two of said elements being switched on in an overlapping portion of their respective subranges.

12. A DC level indicator wherein a sensed DC level of a particular polarity is indicated by the apparent color of light comprising DC input means receiving said DC level within a range having a plurality of subranges; color light generating means including a pair of back-to-back, oppositely polarized LED's emitting different respective primary colors, and positioned together so that when more than one such LED emits light the resulting emitted light appears as a blend of the respective colors; and drive means coupled to said DC input means and powered by voltage of said particular polarity for supplying current to said LED's as a function of the received DC level so that each said LED radiates its respective color light when said DC level is within a respective subrange but substantially ceases to radiate when said DC level is outside its respective subrange, and including mixing means for superimposing an alternating signal on a DC signal corresponding to said DC level, to provide a resulting mixed signal to one end of said pair of LED's, and bias means coupled to the other end of said pair of LED's so that one only of said pair emits light of its color when said DC level is below a first voltage, the other only of said pair emits light of its color when said DC level is above a second voltage, and both LED's of said pair emit light of their respective colors when said DC level is between said first and second voltages.

13. A DC level indicator according to claim 1, wherein when said DC level is within said overlapping portion, the proportion of the respective colors constituting said blend varies gradually with said DC level.

* * * * *